(12) United States Patent
Yamaguchi et al.

(10) Patent No.: US 6,320,233 B1
(45) Date of Patent: Nov. 20, 2001

(54) CMOS SEMICONDUCTOR DEVICE

(75) Inventors: Akira Yamaguchi, Yokohama; Toru Takahashi, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/487,670

(22) Filed: Jan. 19, 2000

(30) Foreign Application Priority Data

Jan. 20, 1999 (JP) .................................... 11-011988

(51) Int. Cl.$^7$ .................................................. H01L 29/76
(52) U.S. Cl. ..................... 257/369; 257/368; 257/371; 257/374; 257/379; 257/401
(58) Field of Search ..................... 257/369, 371, 257/379, 392, 277, 401, 368, 374, 510

(56) References Cited

U.S. PATENT DOCUMENTS

| | | | |
|---|---|---|---|
| 5,753,529 | * | 5/1998 | Chang et al. ......................... 437/67 |
| 5,831,313 | * | 11/1998 | Han et al. ............................ 257/371 |
| 5,877,066 | * | 3/1999 | Stolmeijer et al. ................... 438/424 |
| 5,937,288 | * | 8/1999 | Alsmeier et al. .................... 438/221 |

FOREIGN PATENT DOCUMENTS

| | | | |
|---|---|---|---|
| 60-171761-A | * | 5/1985 | (JP) . |
| 2538856 | | 7/1996 | (JP) . |
| 10-22462 | | 1/1998 | (JP) . |

* cited by examiner

*Primary Examiner*—Tom Thomas
*Assistant Examiner*—Donghee Kang
(74) *Attorney, Agent, or Firm*—Oblon, Spivak, McClelland, Maier & Neustadt, P.C.

(57) ABSTRACT

A CMOS semiconductor device comprises a P-substrate, an N-type shallow well for forming a PMOS transistor and a P-type shallow well for forming NMOS transistor, which are selectively formed in a surface region of the P-substrate, a leading region for the N-type shallow well and a leading region for the P-type shallow well, STI regions for separating the CMOS transistor formed in a surface region of the P-substrate and positioned between the drain region of the PMOS transistor and the drain region of the NMOS transistor and between the N-type shallow well and the P-type shallow well, the STI regions being formed deeper than the shallow wells, and an STI region for isolating the CMOS region formed in a surface region of the P-substrate, the STI region being formed deeper than the shallow wells.

4 Claims, 3 Drawing Sheets

CMOS SEMICONDUCTOR DEVICE

BACKGROUND OF THE INVENTION

The present invention relates to a CMOS semiconductor device, particularly, a CMOS transistor having an element isolating region of STI (Shallow Trench Isolation) structure. The CMOS semiconductor device of the present invention is used for manufacturing a CMOS type LSI.

FIG. 6A is a plan view showing a CMOS transistor having an element isolating region of the conventional STI structure. FIG. 6B is a cross sectional view along the line 6B—6B shown in FIG. 6A. As shown in the drawings, the CMOS transistor comprises a P-type semiconductor substrate (P-substrate) 40. An N-well 41 is selectively formed in a surface region of the P-substrate 40. Also, a P-well 42 is formed adjacent to the N-well 41. A PMOS transistor is formed in the N-well 41, and an NMOS transistor is formed in the P-well 42.

A source region 43 and a drain region 44 of the PMOS transistor are selectively formed in a surface region of the N-well 41. Each of these source region 43 and the drain region 44 consists of a $P^+$ diffusion layer. A gate electrode 45 is formed above a channel region between the source region 43 and the drain region 44 of the PMOS transistor with a gate insulating film 46 interposed therebetween.

A shallow N-well leading region 47 made of an N-type diffusion region is selectively formed in a surface region of the N-well 41. The shallow N-well leading region 47 is used for applying a bias potential (power source potential VDD) to the N-well 41.

An STI region 48 is formed in a surface region of the N-well 41 in a manner to be sandwiched between the $P^+$ source 43 and the shallow N-well leading region 47.

A source region 51 and a drain region 52 of the NMOS transistor are selectively formed in a surface region of the P-well 42. Each of these source region 51 and the drain region 52 made of an $N^+$ diffusion region. A gate electrode 53 is formed above a channel region between the source region 51 and the drain region 52 of the NMOS transistor with a gate insulating film 54 interposed therebetween.

A shallow P-well leading region 55 made of a P-diffusion region is selectively formed in a surface region of the P-well 42. The shallow P-well leading region 55 is used applying a bias potential (ground potential VSS) to the P-well 42.

An STI region 56 is formed in a surface region of the P-well 42 in a manner to be sandwiched between the $N^+$ source region 51 and the shallow P-well leading region 55.

Another STI region 57 is formed at the boundary between the N-well 41 and the P-well 42 in a manner to be sandwiched between the drain region 44 of the PMOS transistor and the drain region 52 of the NMOS transistor. The STI region 57 serves to isolate the PMOS transistor from the NMOS transistor and, thus, acts as a CMOS transistor isolating region.

STI regions 58 and 59 are formed at the boundary regions of the N-well 41 and the boundary regions of the P-well 42, respectively, for isolating these N-well 41 and P-well 42 from other element regions. The CMOS transistor is isolated from the other elements by these STI regions 58 and 59.

In the CMOS transistor of the construction described above, a distance a1 shown in FIG. 6A consists of a distance d1 between the N-well 41 and an $N^+$ SDG (Source Drain Gate) region 60 constituting an active region of the NMOS transistor and a distance d2 between the P-well 42 and a $P^+$ SDG region 50 constituting an active region of the PMOS transistor.

The design criteria of the distance d1 between the N-well 41 and the $N^+$ SDG region 60 are determined in view of the breakdown voltage between the N-well 41 and the $N^+$ SDG region 60, the nonuniformity in the size of the $N^+$ SDG region 60, the nonuniformity in the size of the N-well 41, the pattern aligning accuracy between the N-well 41 and the $N^+$ SDG region 60, etc. Therefore, it is necessary to ensure a very large space for the distance d1 between the N-well 41 and the $N^+$ SDG region 60.

Likewise, the design criteria of the distance d2 between the P-well 42 and the $P^+$ SDG region 50 are determined in view of the breakdown voltage between the P-well 42 and the $P^+$ SDG region 50, the nonuniformity in the size of the $P^+$ SDG region 50, the nonuniformity in the size of the P-well 42, the pattern aligning accuracy between the P-well 42 and the $P^+$ SDG region 50, etc. Therefore, it is necessary to ensure a very large space for the distance d2 between the P-well 42 and the $P^+$ SDG region 60.

As a result, the space between the $P^+$ SDG region 50 and the $N^+$ SDG region 60, in which the CMOS transistor isolating region 57 is interposed, requires a large design criterion. It follows that the semiconductor device includes a large useless space in which the transistor itself is not arranged, making it difficult to further miniaturize the element.

As described above, the conventional CMOS transistor is constructed to include a large space between the active region of an NMOS transistor and the active region of a PMOS transistor with a CMOS transistor isolating region interposed therebetween. It follows that the conventional CMOS transistor includes a large useless region in which the transistor itself is not arranged, making it difficult to further miniaturize the element.

BRIEF SUMMARY OF THE INVENTION

An object of the present invention, which has been achieved in an attempt to overcome the above-noted problems inherent in the prior art, is to provide a CMOS semiconductor device capable of moderating the limitations required in miniaturizing the element so as to diminish the pattern size of the CMOS transistor and the CMOS element region.

The particular object can be achieved by various means in the present invention as summarized below.

According to a first aspect of the present invention, there is provided a CMOS semiconductor device, comprising a semiconductor substrate of a first conductivity type; a well region of a second conductivity type formed selectively in a surface region of the semiconductor substrate; a first shallow well region of the second conductivity type formed selectively in a surface region of the well region in a manner to partly overlap with the well region; a source region and a drain region of a first MOS transistor, the source and drain regions made of diffusion regions of the first conductivity type selectively formed in a surface region of the first shallow well region; a first gate electrode formed above a channel region between the source region and drain region of the first MOS transistor with a gate insulating film interposed therebetween; a first shallow well leading region made of a diffusion region of the second conductivity type selectively formed in a surface region of the well region; a first shallow trench isolating region formed in a surface region of the well region, the first shallow trench isolating region being deeper than the first shallow well region, between the diffusion region of the first conductivity type of the first MOS transistor and the first shallow well leading region; a source region and a drain region of a second MOS transistor made of diffusion regions of the second conductivity type that are formed in a surface region of the semiconductor substrate; a second gate electrode formed above a channel region between the source region and drain region of the second MOS transistor with a gate insulating film interposed therebetween; and a second shallow trench isolating region for separating the CMOS transistor formed in a surface region of the semiconductor substrate, the second shallow trench isolating region being deeper than the first shallow well region, between the first shallow well region and the diffusion region of the second conductivity type of the second MOS transistor.

It is possible for the CMOS semiconductor device according to the first aspect of the present invention to comprise further a second shallow well region of the second conductivity type formed selectively in a surface region of the well region.

According to a second aspect of the present invention, there is provided a semiconductor device comprising a semiconductor substrate of a first conductivity type; a well region of a second conductivity type formed selectively in a surface region of the semiconductor substrate; a first shallow well region of the second conductivity type formed selectively in a surface region of the well region in a manner to partly overlap with the well region; a source region and a drain region of a first MOS transistor, the source and drain regions made of diffusion regions of the first conductivity type formed selectively in a surface region of the first shallow well region; a first gate electrode formed above a channel region between the source region and drain region of the first MOS transistor with a gate insulating film interposed therebetween; a second shallow well region of the second conductivity type formed selectively in a surface region of the well region; a first shallow well leading region made of a diffusion region of the second conductivity type formed selectively in a surface region of the second shallow well region; first shallow trench isolating regions formed in a surface region of the well region and positioned between the drain region of the first MOS transistor and the first shallow well leading region and between the first shallow well region and the second shallow well region, the first shallow trench isolating regions being formed deeper than the first shallow well region and the second shallow well region; a third shallow well region of the first conductivity type formed selectively in a surface region of the semiconductor substrate; a fourth shallow well region of the first conductivity type formed selectively in a surface region of the semiconductor substrate; a source region and a drain region of a second MOS transistor, the source and drain regions made of diffusion regions of the second conductivity type formed selectively in a surface region of the third shallow well region; a second gate electrode formed above a channel region between the source region and the drain region of the second MOS transistor with a gate insulating film interposed therebetween; a second shallow well leading region made of a diffusion region of the first conductivity type formed selectively in a surface region of the fourth shallow well region; second shallow trench isolating regions formed in a surface region of the semiconductor substrate and positioned between the drain region of the second MOS transistor and the second shallow well leading region and between the third shallow well region and the fourth shallow well region, the second shallow trench isolating regions being formed deeper than the third shallow well region and the fourth shallow well region; third shallow trench isolating regions formed in a surface region of the semiconductor substrate and positioned between the drain region of the first MOS transistor and the drain region of the second MOS transistor and between the first shallow well region and the third shallow well region, the third shallow trench isolating regions being formed deeper than the first shallow well region and the third shallow well region; and fourth shallow trench isolating regions for isolating CMOS regions, the fourth shallow trench isolating regions being formed in a surface region of the semiconductor substrate for isolating another element region from the first shallow well leading region and for isolating still another element region from the second shallow well leading region.

It is possible for the CMOS semiconductor device according to the second aspect of the present invention to comprise further a well region of the first conductivity type formed in a surface region of the semiconductor substrate and positioned to connect the bottom region of the third shallow well region to the bottom region of the fourth shallow well region.

According to a third aspect of the present invention, there is provided a semiconductor device comprising a semiconductor substrate of a first conductivity type; a first shallow well region of the second conductivity type formed selectively in a surface region of the semiconductor substrate; a source region and a drain region of a first MOS transistor, the source and drain regions made of diffusion regions of the first conductivity type formed selectively in a surface region of the first shallow well region; a first gate electrode formed above a channel region between the source region and drain region of the first MOS transistor with a gate insulating film interposed therebetween; a first shallow well leading region made of a diffusion region of the second conductivity type formed in a surface region of the first shallow well region and contiguous to the drain region of the first MOS transistor; a second shallow well region of the first conductivity type formed selectively in a surface region of the semiconductor substrate; a source region and a drain region of a second MOS transistor made of diffusion regions of the second conductivity type formed in a surface region of the second shallow well region; a second gate electrode formed above a channel region between the source region and the drain region of the second MOS transistor with a gate insulating film interposed therebetween; a second shallow well leading region made of a diffusion region of the first conductivity type formed in a surface region of the second shallow well region and positioned contiguous to the drain region of the second MOS transistor; first shallow trench isolating regions formed in a surface region of the semiconductor substrate and positioned between the drain region of the first MOS transistor and the drain region of the second MOS transistor and between the first shallow well region and the second shallow well region, the first shallow trench isolating regions being formed deeper than the first shallow well region and the second shallow well region; and second shallow trench isolating regions for isolating CMOS regions, the second shallow trench isolating regions being formed in a surface region of the semiconductor substrate for isolating another element region from the source region of the first MOS transistor and for isolating still another element region from the source region of the second MOS transistor.

As described above, the CMOS semiconductor device of the present invention permits moderating the limitations required for miniaturizing the element, making it possible to miniaturize the pattern size of the CMOS transistor or the CMOS element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described in detail with reference to the accompanying drawings.

First Embodiment

Figure 1A:
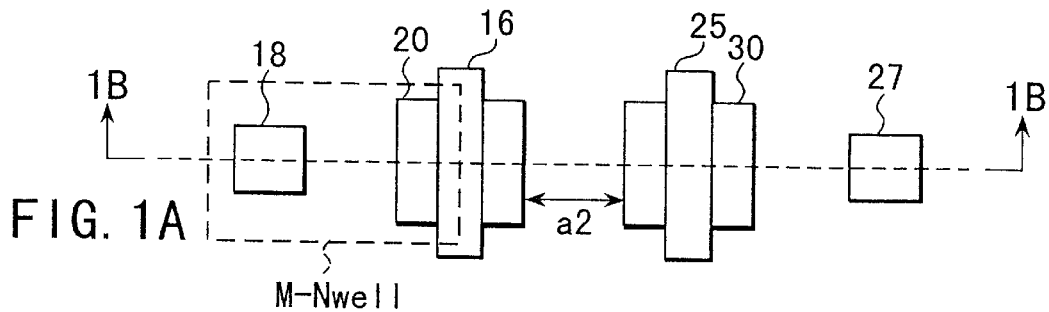
FIG. 1A is a plan view showing a CMOS transistor according to a first embodiment of the present invention.
Figure 1B:
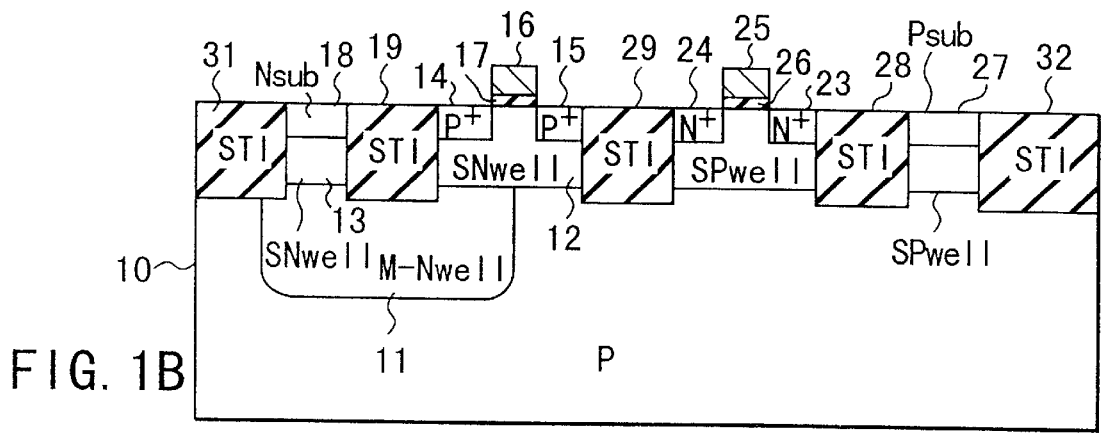
FIG. 1B is a cross sectional view along the line 1B—1B shown in FIG. 1A.

FIG. 1A is a plan view showing a CMOS transistor comprising an element isolating region of the STI structure according to the first embodiment of the present invention. FIG. 1B is a cross sectional view along the line 1B—1B shown in FIG. 1A.

In FIGS. 1A and 1B, reference numeral 10 denotes a P-type semiconductor substrate (P-substrate), and reference numeral 11 denotes an N-well selectively formed in a surface region of the P-substrate 10 by ion implantation.

Reference numeral 12 denotes a first shallow N-well formed shallow selectively in a surface region of the N-well 11 in a manner to overlap partly with the N-well 11. A PMOS transistor is formed within the first shallow N-well 12. Reference numeral 13 denotes a second shallow N-well formed shallow selectively in a surface region of the N-well 11 by ion implantation.

Reference numerals 14 and 15 denote a source region and a drain region, respectively, of the PMOS transistor. These source and drain regions 14 and 15, which are P$^+$ diffusion layers, are formed selectively in a surface region of the first shallow N-well 12 by ion implantation. Reference numeral 16 denotes a gate electrode consisting of a doped polycrystalline silicon (polysilicon). The gate electrode 16 is formed above a channel region between the source region 14 and the drain region 15 of the PMOS transistor with a gate insulating film 17 interposed therebetween.

Reference numeral 18 denotes a shallow N-well leading region formed in a surface region of the second shallow N-well 13 and consisting of an N-diffusion region. A bias potential (power source potential VDD) is applied to the first shallow N-well 12 through the shallow N-well leading region 18, the second shallow N-well 13 and the N-well 11.

Reference numeral 19 denotes a first STI region formed in a surface region of the N-well 11 and positioned between the P$^+$ source region 14 and the shallow N-well leading region 18 and between the first shallow N-well 12 and the second shallow N-well 13.

Reference numeral 21 is a first shallow P-well region formed selectively in a surface region of the P-substrate 10 by ion implantation. An NMOS transistor is formed within the first shallow P-well 21. Reference numeral 22 denotes a second shallow P-well formed selectively in a surface region of the P-substrate 10 by ion implantation. Incidentally, it is possible to omit these first and second shallow P-wells 21 and 22, if necessary, though these first and second P-wells 21 and 22 are formed in the first embodiment of the present invention.

Reference numerals 23 and 24 denote a source region and a drain region, respectively, of an NMOS transistor. These source and drain regions 23 and 24 made of N$^+$ diffusion regions formed selectively in a surface region of the first shallow P-well 21 by means of ion implantation. Reference numeral 25 denotes a gate electrode (doped polysilicon) formed above a channel region between the source region 23 and the drain region 24 of the NMOS transistor with a gate insulating film 26 interposed therebetween.

Reference numeral 27 denotes a shallow P-well leading region formed in a surface region of the second shallow P-well 22. The second shallow P-well 22 made of a P-diffusion region. It should be noted that a bias potential (ground potential VSS) is applied to the first shallow P-well 21 through the shallow P-well leading region 27, the second shallow P-well 22 and the P-substrate 10.

Reference numeral 28 denotes a second STI region formed in a surface region of the P-substrate 10 and positioned between the N$^+$ source region 23 and the shallow P-well leading region 27 and between the first shallow P-well 21 and the second shallow P-well 22.

Reference numeral 29 denotes a third STI region formed in a surface region of the P-substrate 10 and positioned between the drain region 15 of the PMOS transistor and the drain region 24 of the NMOS transistor and between the first shallow N-well 12 and the first shallow P-well 21. The third STI region 29 acts as a CMOS transistor isolating region for isolating the PMOS transistor and the NMOS transistor from each other.

Reference numerals 31 and 32 denote fourth STI regions formed in a boundary region between the shallow N-well leading region 18 of the PMOS transistor and another element region (not shown) and in a boundary region between the shallow P-well leading region 27 of the NMOS transistor and still another element region (not shown), respectively. The CMOS transistor is isolated from another element by these fourth STI regions 31 and 32.

Incidentally, the source region 14 and the drain region 15 of the PMOS transistor and the source region 23 and the drain region 24 of the NMOS transistor are formed in substantially the same depth.

Also, the first shallow N-well 12, the second shallow N-well 13, the first shallow P-well 21 and the second shallow P-well 22 are formed in substantially the same depth. On the other hand, the first shallow N-well 12, the second shallow N-well 13, the first shallow P-well 21 and the second shallow P-well 22 are formed deeper than the source regions 14, 23 and the drain regions 15, 24 and shallower than the STI regions 19, 29, 31, 32 and the N-well 11. These STI regions 19, 29, 31 and 32 are formed in substantially the same depth and formed shallower than the N-well 11.

Incidentally, each of the source regions 14, 23 and the drain regions 15, 24 is formed in a depth of 0.2 $\mu$m or less, e.g., 0.1 $\mu$m. The depth of each of the shallow wells 12, 13, 21 and 23 is not larger than 0.5 $\mu$m, e.g., 0.3 $\mu$m. Also, the depth of each of the STI regions 19, 29, 31 and 32 is not larger than 0.6 $\mu$m, e.g., 0.4 $\mu$m.

For forming a CMOS inverter by using the CMOS transistor of the construction described above, a wiring is formed to connect the drain region 15 of the PMOS transistor to the drain region 24 of the NMOS transistor. Also, the gate electrode 16 of the PMOS transistor is connected to the gate electrode 25 of the NMOS transistor. Further, the source region 14 of the PMOS transistor is connected to a power source potential VDD node, and the source region 23 of the NMOS transistor is connected to a ground potential VSS node.

According to the first embodiment described above, each of the shallow wells 12, 13, 21, 22 is formed shallower than each of the STI regions 19, 28, 29, 31 and 32. Also, the first shallow N-well 12, which is a substrate region of the PMOS transistor, is isolated from the first shallow P-well 21, which is a substrate region of the NMOS transistor, by the third STI region 29 for separating the CMOS transistor. Further, it suffices to form the N-well 11 on the bottom side of the first shallow N-well 13 in a manner to be contiguous to the second shallow N-well 13 below the shallow N-well leading region 18, and the N-well 11 may be positioned remoter from the third STI region 29 for separating the CMOS transistor than the first shallow N-well 12.

It follows that, in designing the pattern of the CMOS transistor, it is unnecessary to consider the withstand voltage between the N-well 11 and the P$^+$ SDG region 30, the nonuniformity in the size of the N-well 11, and the pattern aligning accuracy between the N-well 11 and the P$^+$ SDG region 20 as the criterion for determining the distance a2 shown in FIG. 1A between the P$^+$ SDG region 20 and the N$^+$ SDG region 30, i.e., the distance between the first shallow N-well 12 and the first shallow P-well 21. In other words, the distance a2 can be determined by only the width of the third STI region 29 for separating the CMOS transistor in order to obtain a desired withstand voltage.

As a result, the limitations required for miniaturizing the element can be moderated, and the distance a2 can be made shorter than the conventional distance a1. It follows that the spaces of the P$^+$ SDG 20 and the N$^+$ SDG region 30 having the CMOS transistor separating region (third STI region) 29 interposed therebetween can be diminished so as to diminish the pattern size of the CMOS transistor.

In other words, the spaces of the P$^+$ SDG 20 and the N$^+$ SDG region 30 having the CMOS transistor separating region 29 interposed therebetween can be realized by the space between diffusion regions of different conductivity types such as the space between the P$^+$ SDG region 20 and the shallow N-well leading region 18. What should be noted is that the space can be diminished to ½, though a space substantially double the space between diffusion regions of different conductivity types was required in the prior art.

In this case, it is possible to diminish the cell size of a cell in which spaces of the N$^+$ SDG region and the P$^+$ SDG region occupy a large ratio relative to the entire area of the cell such as a primitive of S.C. (Standard Cell) or memory cell. As a result, the gross per wafer can be markedly increased, leading to a prominent reduction in the chip cost.

Modification of the First Embodiment

Figure 2:
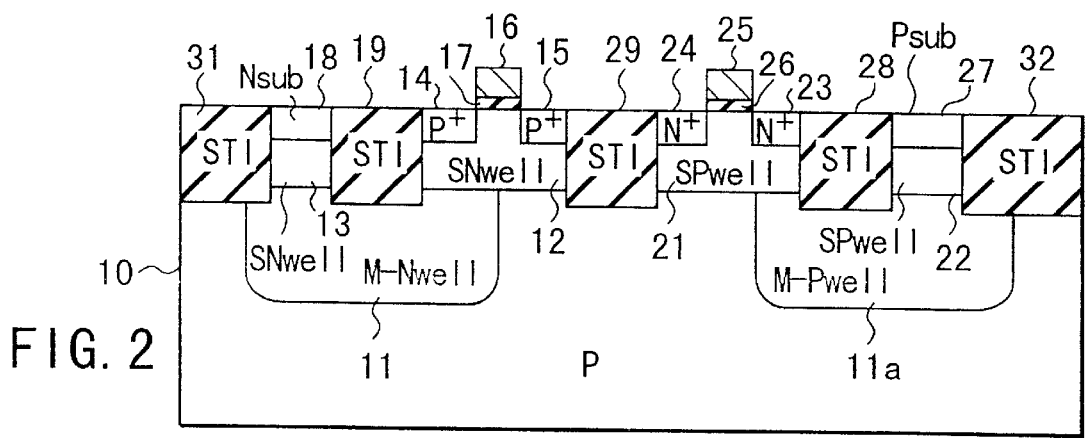
FIG. 2 is a cross sectional view showing a first modification of the CMOS transistor shown in FIG. 1.

FIG. 2 is a cross sectional view showing a CMOS transistor according to a first modification of the first embodiment of the present invention. Those members of the CMOS transistor shown in FIG. 2 which are equal to those of the CMOS transistor shown in FIG. 1B are denoted by the same reference numerals and, thus, that construction alone which differs from that shown in FIG. 1B will be explained in the following description.

As shown in FIG. 2, a P-well 11a, which corresponds to the substrate region of the NMOS transistor formed within the P-substrate 10, is formed in the first modification on the bottom sides of the first shallow P-well 21 and the second shallow P-well 22. The P-well 11a serves to electrically connect the first shallow P-well 21 to the second shallow P-well 22 and is formed in a depth substantially equal to the depth of the N-well 11. The first modification differs from the CMOS transistor shown in FIG. 1B in only the construction described above and is equal to the CMOS transistor shown in FIG. 1B in the other constructions.

According to the first modification, the P-well 11a is used in place of the P-substrate 10 for electrically connecting the first shallow P-well 21 to the second shallow P-well 22. As a result, the effects basically equal to those produced by the first embodiment can be produced by the first modification.

Figure 3:
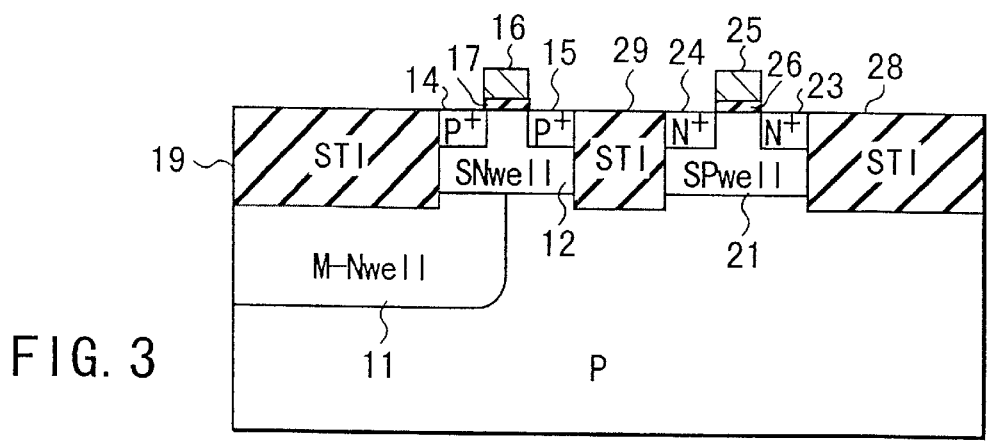
FIG. 3 is a cross sectional view showing a second modification of the CMOS transistor shown in FIG. 1.

FIG. 3 is a cross sectional view showing a CMOS transistor according to a second modification of the first embodiment of the present invention. Those members of the CMOS transistor shown in FIG. 3 which are equal to those of the CMOS transistor shown in FIG. 1B are denoted by the same reference numerals and, thus, that construction alone which differs from that shown in FIG. 1B will be explained in the following description.

As shown in FIG. 3, the second shallow N-well 13, the shallow N-well leading region 18, the second shallow P-well 22 and the shallow P-well leading region 27 are omitted in the second modification. The second modification differs from the CMOS transistor shown in FIG. 1B in only the construction described above and is equal to the CMOS transistor shown in FIG. 1B in the other constructions.

According to the second modification, it is possible to obtain the effects similar to those produced by the first embodiment.

Second Embodiment

Figure 4A:
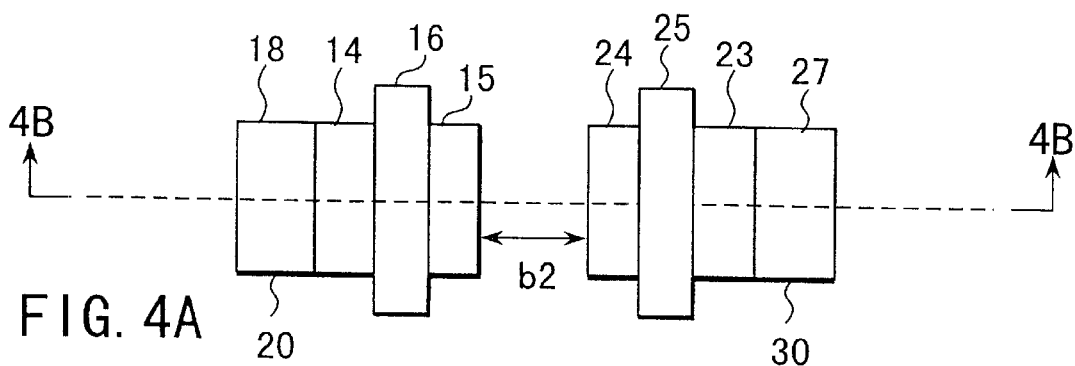
FIG. 4A is a plan view showing a CMOS transistor according to a second embodiment of the present invention.
Figure 4B:
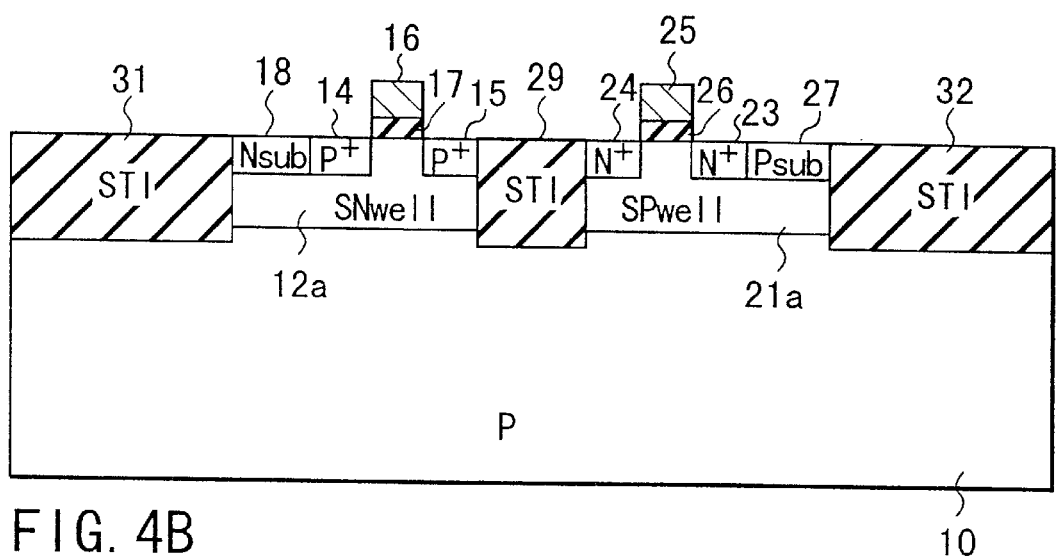
FIG. 4B is a cross sectional view along the line 4B—4B shown in FIG. 4A.

FIG. 4A is a plan view showing a CMOS transistor having an element isolation region of the STI structure according to the second embodiment of the present invention. FIG. 4B is a cross sectional view along the line 4B—4B shown in FIG. 4A. Those members of the CMOS transistor shown in FIGS. 4A and 4B which are equal to those of the CMOS transistor shown in FIGS. 1A and 1B are denoted by the same reference numerals and, thus, that construction alone which differs from that shown in FIG. 1B will be explained in the following description.

As shown in FIGS. 4A and 4B, the N-well 11, the first STI region 19 and the second STI region 28 shown in FIG. 1B are omitted in the CMOS transistor of the second embodiment.

To be more specific, a shallow N-well 12a is formed between the third STI region 29 and the fourth STI region 31 in the PMOS transistor. The shallow N-well 12a is equal to a region obtained by forming the first shallow N-well 12 and the second shallow N-well 13 shown in FIG. 1B contiguous to each other. Likewise, a shallow P-well 21a is formed between the third STI region 29 and the fourth STI region 32. The shallow P-well 21a is equal to a region obtained by forming the first shallow P-well 21 and the second shallow P-well 22 shown in FIG. 1B contiguous to each other. Also, the N$^+$ source region 14 of the PMOS transistor and the shallow N-well leading region 18 are formed contiguous to each other, and the P$^+$ source region 23 of the NMOS transistor and the shallow P-well leading region 27 are formed contiguous to each other.

The CMOS transistor of the second embodiment differs from the CMOS transistor shown in FIGS. 1A and 1B in only the construction described above and is equal to the CMOS transistor shown in FIGS. 1A and 1B in the other constructions.

According to the second embodiment, the distance b2 between the P$^+$ SDG region 20 and the N$^+$ SDG region 30 shown in FIG. 4A, i.e., the distance between the first shallow N-well 12 and the first shallow P-well 21, can be determined by only the width of the third STI region 29 for separating the CMOS transistor in designing the pattern of the CMOS transistor, as in the first embodiment described previously.

Further, in the PMOS transistor, the ion implantation for forming the source region 14 and the drain region 15 is performed separately from the ion implantation for forming the shallow N-well leading region 18 so as to form the P$^+$ source region 14, the P$^+$ drain region 15, and the shallow N-well leading region 18 within the same shallow N-well 12a. Therefore, it is possible to omit the first STI region 19 and the N-well 11 shown in FIG. 1B.

Similarly, in the NMOS transistor, the ion implantation for forming the source region 23 and the drain region 24 is performed separately from the ion implantation for forming the shallow P-well leading region 27 so as to form the N$^+$ source region 23, the N$^+$ drain region 24, and the shallow P-well leading region 27 within the same shallow P-well 21a. Therefore, it is possible to omit the second STI region 28 shown in FIG. 1B.

It should be noted that, since it is possible to omit the first and second STI regions 19 and 28, the pattern size of the CMOS element region in the second embodiment can be made smaller than the pattern size of the CMOS element region in the first embodiment.

Modification of Second Embodiment

Figure 5:
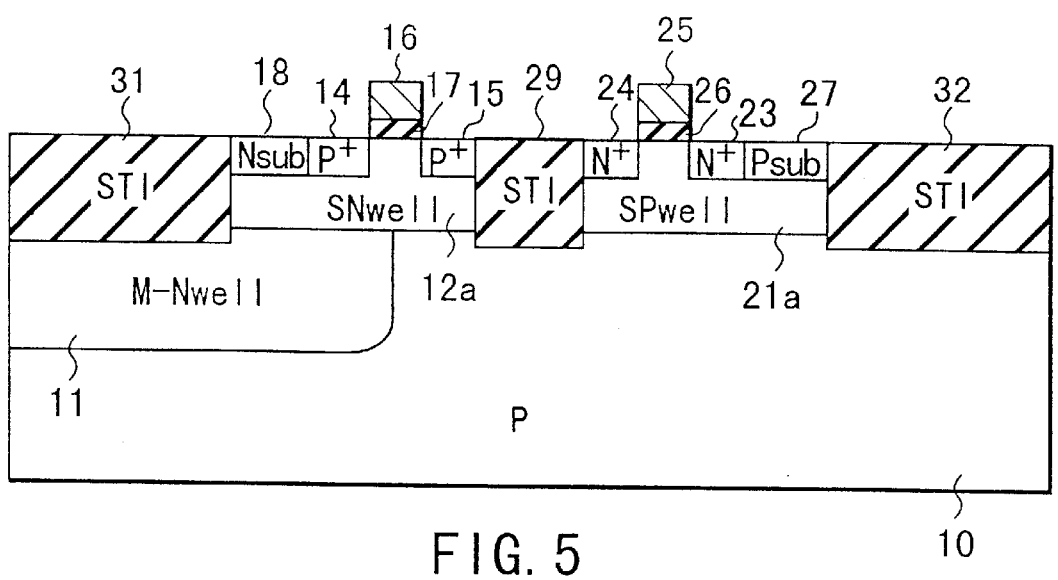
FIG. 5 is a cross sectional view showing a modification of the CMOS transistor shown in FIG. 4.
Figure 6A:
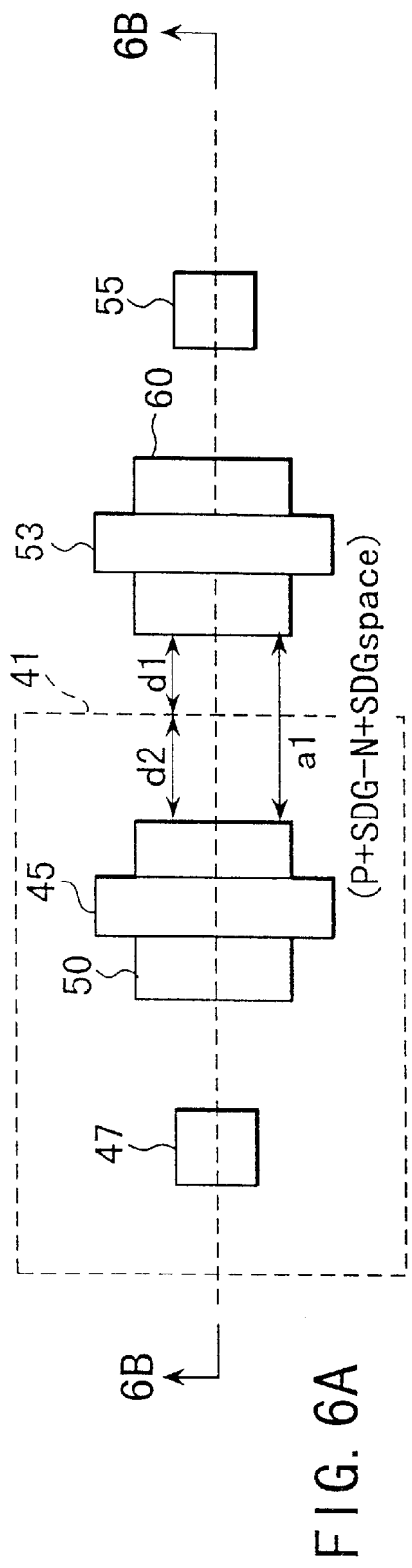
FIG. 6A is a plan view showing a conventional CMOS transistor.
Figure 6B:
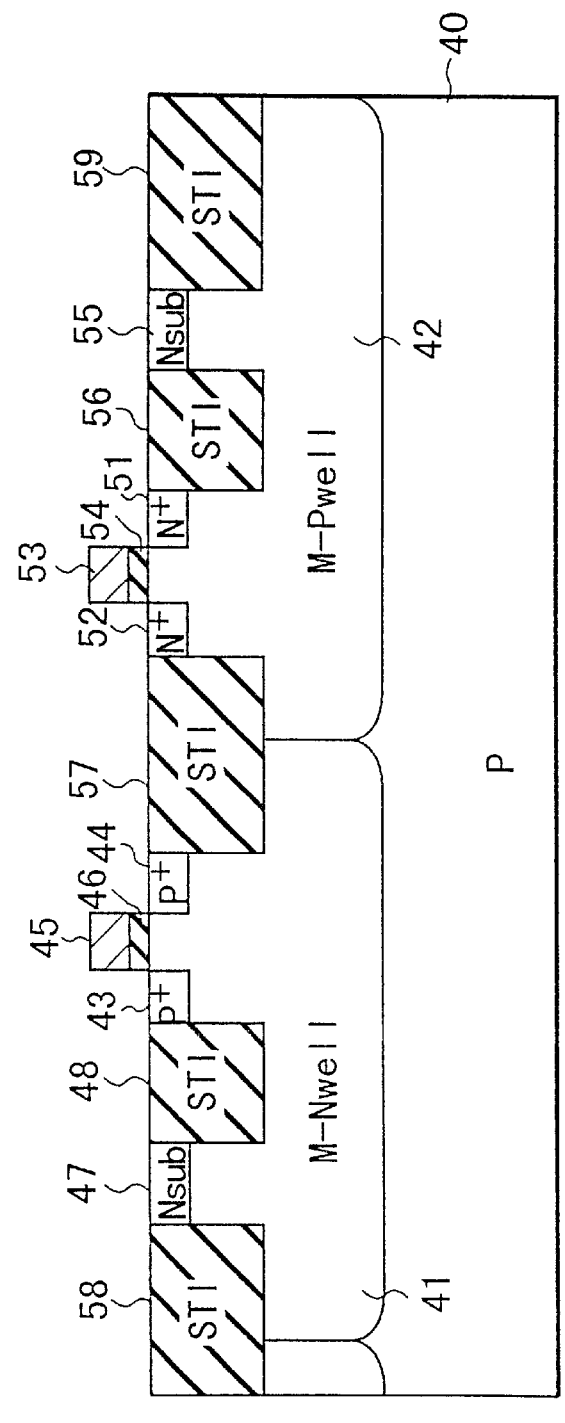
FIG. 6B is a cross sectional view along the line 6B—6B shown in FIG. 6A.

FIG. 5 is a cross sectional view showing a CMOS transistor according to a modification of the second embodiment. Those members of the CMOS transistor shown in FIG. 5 which are equal to those of the CMOS transistor shown in FIG. 4B are denoted by the same reference numerals and, thus, that construction alone which differs from that shown in FIG. 4B will be explained in the following description.

As shown in FIG. 5, an N-well 11 is formed selectively in a surface region of the P-substrate 10 by ion implantation in the modification of the second embodiment. The CMOS transistor shown in FIG. 5 differs only in this point from the CMOS transistor shown in FIG. 4B and is equal to the CMOS transistor shown in FIG. 4B in the other constructions.

According to the modification of the second embodiment, it is possible to obtained the effects similar to those produced by the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A CMOS semiconductor device, comprising:
   a semiconductor substrate of a first conductivity type;
   a well region of a second conductivity type formed selectively in a surface region of said semiconductor substrate;
   a first shallow well region of the second conductivity type formed selectively in a surface region of said well region in a manner to partly overlap with said well region;
   a source region and a drain region of a first MOS transistor, said source and drain regions made of diffusion regions of the first conductivity type selectively formed in a surface region of said first shallow well region;
   a first gate electrode formed above a channel region between the source region and drain region of said first MOS transistor with a gate insulating film interposed therebetween;
   a first shallow well leading region made of a diffusion region of the second conductivity type selectively formed in a surface region of said well region;
   a first shallow trench isolating region formed in a surface region of the well region, said first shallow trench isolating region being deeper than said first shallow well region, between the diffusion region of the first conductivity type of the first MOS transistor and the first shallow well leading region;
   a source region and a drain region of a second MOS transistor made of diffusion regions of the second conductivity type that are formed in a surface region of said semiconductor substrate;
   a second gate electrode formed above a channel region between the source region and drain region of the second MOS transistor with a gate insulating film interposed therebetween; and
   a second shallow trench isolating region for separating the CMOS transistor formed in a surface region of the semiconductor substrate, said second shallow trench isolating region being deeper than said first shallow well region, between said first shallow well region and the diffusion region of the second conductivity type of the second MOS transistor.

2. The CMOS semiconductor device according to claim 1, further comprising a second shallow well region of the second conductivity type formed selectively in a surface region of the well region.

3. A CMOS semiconductor device, comprising:
   a semiconductor substrate of a first conductivity type;
   a well region of a second conductivity type formed selectively in a surface region of said semiconductor substrate;
   a first shallow well region of the second conductivity type formed selectively in a surface region of said well region in a manner to partly overlap with the well region;
   a source region and a drain region of a first MOS transistor, said source and drain regions made of diffusion regions of the first conductivity type formed selectively in a surface region of the first shallow well region;

a first gate electrode formed above a channel region between the source region and drain region of the first MOS transistor with a gate insulating film interposed therebetween;

a second shallow well region of the second conductivity type formed selectively in a surface region of the well region;

a first shallow well leading region made of a diffusion region of the second conductivity type formed selectively in a surface region of the second shallow well region;

first shallow trench isolating regions formed in a surface region of the well region and positioned between the source region of the first MOS transistor and the first shallow well leading region and between the first shallow well region and the second shallow well region, said first shallow trench isolating regions being formed deeper than the first shallow well region and the second shallow well region;

a third shallow well region of the first conductivity type formed selectively in a surface region of the semiconductor substrate;

a fourth shallow well region of the first conductivity type formed selectively in a surface region of the semiconductor substrate;

a source region and a drain region of a second MOS transistor, said source and drain regions made of diffusion regions of the second conductivity type formed selectively in a surface region of the third shallow well region;

a second gate electrode formed above a channel region between the source region and the drain region of the second MOS transistor with a gate insulating film interposed therebetween;

a second shallow well leading region made of a diffusion region of the first conductivity type formed selectively in a surface region of the fourth shallow well region;

second shallow trench isolating regions formed in a surface region of the semiconductor substrate and positioned between the source region of the second MOS transistor and the second shallow well leading region and between the third shallow well region and the fourth shallow well region, said second shallow trench isolating regions being formed deeper than the third shallow well region and the fourth shallow well region;

third shallow trench isolating regions formed in a surface region of the semiconductor substrate and positioned between the drain region of the first MOS transistor and the drain region of the second MOS transistor and between the first shallow well region and the third shallow well region, said third shallow trench isolating regions being formed deeper than the first shallow well region and the third shallow well region; and fourth shallow trench isolating regions for isolating CMOS regions, said fourth shallow trench isolating regions being formed in a surface region of the semiconductor substrate for isolating another element region from the first shallow well leading region and for isolating still another element region from the second shallow well leading region.

4. The CMOS semiconductor device according to claim 3, further comprising a well region of the first conductivity type formed in a surface region of the semiconductor substrate and positioned to connect the bottom region of the third shallow well region to the bottom region of the fourth shallow well region.

* * * * *